(12) United States Patent
Ikenaka et al.

(10) Patent No.: US 7,118,458 B2
(45) Date of Patent: Oct. 10, 2006

(54) METHOD FOR POLISHING SILICON CARBIDE CRYSTAL SUBSTRATE

(75) Inventors: Naoyuki Ikenaka, Saijo (JP); Hideji Fukuda, Toon (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/207,109

(22) Filed: Aug. 18, 2005

(65) Prior Publication Data

US 2006/0040593 A1 Feb. 23, 2006

(30) Foreign Application Priority Data

Aug. 23, 2004 (JP) ............... 2004-241843

(51) Int. Cl.
*B24B 7/22* (2006.01)
(52) U.S. Cl. .......................... 451/41; 451/37
(58) Field of Classification Search ................ 451/41, 451/37, 36, 57, 60, 446
See application file for complete search history.

(56) References Cited

U.S. PATENT DOCUMENTS 5,895,583 A    4/1999  Augustine et al.
5,898,008 A *  4/1999  Kolker et al. ............ 428/846.3

FOREIGN PATENT DOCUMENTS

JP    11-188610    * 7/1999  ............... 451/37
JP    2001-508597    6/2001

* cited by examiner

*Primary Examiner*—Robert A. Rose
(74) *Attorney, Agent, or Firm*—Hamre, Schumann, Mueller & Larson, P.C.

(57) ABSTRACT

A method for polishing a silicon carbide crystal substrate according to the present invention includes a polishing process of polishing a silicon carbide crystal substrate having a surface roughness Rz of at most 50 μm, using an abrasive solution containing abrasive particles made of boron carbide. Accordingly, it is possible, by using boron carbide as abrasive particles instead of conventionally used diamond, to reduce the damage caused to silicon carbide crystals, which constitute the material to be polished, and to the surface of the polishing surface plate, and to perform surface polishing precisely.

18 Claims, 1 Drawing Sheet

METHOD FOR POLISHING SILICON CARBIDE CRYSTAL SUBSTRATE

BACKGROUND OF THE INVENTION

1. Field of the Invention

The present invention relates to technologies pertaining to polishing of silicon carbide crystals, and particularly to crystal polishing technologies pertaining to rough polishing.

2. Description of Related Art

Power devices that handle electric energy with low loss are used widely since they achieve a significant reduction in power consumption. Currently available power devices are manufactured from silicon substrates. However, due to the inherent characteristics of silicon, there is a limit to the further enhancement of the performance of these devices. In particular, since silicon cannot be used at high temperatures, there is a need for a material to replace silicon.

For this reason, silicon carbide (SiC) recently has been receiving attention. The width of the forbidden band of silicon carbide is three times wider than the width of the forbidden band of silicon, so that silicon carbide can be used at a higher temperature than silicon. The dielectric strength of silicon carbide is about ten times greater than that of silicon, and therefore, further miniaturization of power devices can be achieved through the use of silicon carbide. Moreover, the thermal conductivity of SiC is about three times higher than that of silicon, so that silicon carbide also has an advantage in that it has excellent heat dissipation and is easier to cool. Since silicon carbide has excellent characteristics as described above, silicon carbide substrates are promising substrates to replace silicon substrates for power devices.

In order to produce power devices from silicon carbide substrates, it is ultimately necessary to polish the surface of the substrates to be as smooth as possible. At present, a silicon carbide ingot that has been manufactured by crystal growth is sliced first, for example, by a wire saw or a blade saw. Then, grinding is performed to remove any irregularities present in the substrate, and thereafter, rough polishing using a hard polishing surface plate and precision (mirror surface) polishing using a soft polishing pad are performed. Of these steps, precision polishing is the most important step, and known techniques, such as the polishing technique disclosed in JP 2001-508597A, that use a suspension containing abrasive diamond particles or $SiO_2$ (colloidal silica) commonly are used for precision polishing at present. Similarly, rough polishing, which is a pre-treatment step for a final processed surface, is a step that is as important as precision polishing. If the substrate is in good state after rough polishing, then the processing time may be expected to be reduced in the final step.

However, since the technique disclosed in JP 2001-508597A uses diamond as abrasive particles, a significant amount of damage is caused to the objects to be polished, although the time required for polishing (processing rate) is short. That is, during polishing, great damage is caused to silicon carbide crystals, and flocs that are produced from the abrasive diamond particles tend to cause damage to silicon carbide crystals. Furthermore, the rough polishing step uses a hard polishing surface plate. Therefore, a significant amount of damage also is caused to the polishing surface plate, and it is necessary to correct the surface of the polishing surface plate during the subsequent polishing. In rough polishing using a hard polishing surface plate, the shape of the polishing surface plate is transferred onto the silicon carbide substrate, which is the material to be polished. Accordingly, when rough polishing is carried out with a polishing surface plate whose surface has not been corrected, the state of the processed surface of the silicon carbide substrate may deteriorate. Therefore, it is necessary to reduce the damage caused to the polishing surface plate when polishing silicon carbide crystals.

SUMMARY OF THE INVENTION

Therefore, in order to solve the above-described conventional problems, the present invention provides a method for polishing a silicon carbide crystal substrate by which it is possible to reduce the damage caused to silicon carbide crystals and a hard polishing surface plate when obtaining a pre-treatment surface of the silicon carbide substrate before the final processing, and to perform surface polishing precisely.

A method for polishing a silicon carbide crystal substrate according to the present invention is a method for polishing a silicon carbide crystal substrate, the method including: a polishing process of polishing a silicon carbide crystal substrate having a surface roughness Rz of at most 50 μm, using an abrasive solution containing abrasive particles made of boron carbide.

DETAILED DESCRIPTION OF THE INVENTION

Figure 1A:
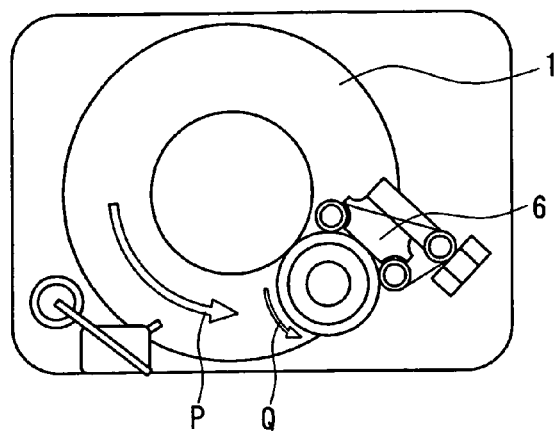
FIG. 1A is a plan view of a polishing apparatus according to one embodiment of the present invention.

The present invention is used when performing rough polishing for silicon carbide crystal substrates. "Rough polishing" as mentioned herein refers to processing a silicon carbide crystal substrate having a surface roughness Rz of greater than 1 μm and at most 50 μm to have an Rz of at most 1 μm after the polishing.

"Surface roughness Rz" as used herein refers to a value defined according to JIS B0601, and is the sum of the maximum value of the height of peaks and the maximum value of the depth of troughs of a profile curve over a reference length. In the present invention, the surface roughness Rz is measured using a surface roughness meter of the optical interference type (product name "Newview5032", manufactured by Zygo Corporation).

An abrasive solution containing abrasive particles made of boron carbide is used as the abrasive solution. Preferably, the boron carbide has an average particle size of at most 100 μm. More specifically, since the present invention is intended for several stages of processing steps even within rough polishing, it is preferable, for example, to use boron carbide having an average particle size of 60 to 100 μm for a SiC substrate in which Rz is 50 μm, and to use boron carbide having an average particle size of at most 10 μm for a SiC substrate in which Rz is in the vicinity of 1 μm. The boron carbide particles are amorphous.

Here, the average particle size is measured by a natural centrifugal sedimentation method using a "CAPA-300" (product name), manufactured by HORIBA, Ltd. as a measurement apparatus. Specifically, a sample solution containing about 1 wt % of the abrasive particles is centrifuged in the measurement apparatus, so that the average particle size is measured based on the sedimentation rate of the abrasive particles.

For this abrasive solution, it is preferable to use an abrasive solution in which boron carbide is dispersed in, for example, pure water as abrasive particles at a ratio of at least 0.1 wt % and at most 5 wt %. Here, the term 'pure water' denotes ion exchange water.

The polishing method according to the present invention can be used from rough polishing through finish polishing.

In the method of the present invention, it is preferable that a polishing vessel containing the abrasive solution is placed on a polishing surface plate that polishes the silicon carbide crystal substrate, and that the abrasive solution is dropped onto the polishing surface plate, while performing stirring in the polishing vessel such that the abrasive particles contained in the abrasive solution inside the polishing vessel do not settle out. This allows an abrasive solution having a uniform composition to be supplied onto the surface of the silicon carbide crystal substrate, thus also providing a uniform polished surface.

It is preferable that the polishing process according to the present invention includes a plurality of polishing steps in which the average particle sizes of the abrasive particles that are used are different. This makes it possible to perform polishing gradually.

In the above-described polishing process, it is preferable that an average particle size of the abrasive particles that are used in an initial step is larger than an average particle size of the abrasive particles that are used in a final step, and that the average particles size decreases gradually as the polishing process advances. This makes it possible to advance the polishing process gradually, from rough polishing to precision polishing.

Furthermore, in the method for polishing silicon carbide crystal substrate according to the present invention, it is preferable that the average particle size of the abrasive particles that is used in the initial step is at least 60 μm and at most 100 μm, and that the average particle size of the abrasive particles that is used in the final step is at most 10 μm. The reason is as follows. The purpose of the initial polishing step is to perform polishing at a high processing rate, whereas the purpose of the final polishing step, in contrast, is to improve the surface roughness. Therefore, abrasive particles of larger size are used for the initial polishing step and abrasive particles of smaller size are used for the final polishing step. Although the smallest average particle size of commercially available boron carbide is 1 μm, the final polishing step may be carried out with abrasive particles having an average particle size of, for example, 0.8 μm or 0.6 μm that have been obtained through classification or the like.

Furthermore, it is preferable that the polishing surface plate used in the present invention has a rotational speed of at least 5 rpm and at most 40 rpm, and that the abrasive solution is dropped onto the polishing surface plate at a rate of at least 5 cc/min. This makes it possible to perform polishing efficiently. The conditions mentioned herein are conditions established for avoiding drying of the polishing surface plate, and there is no lower limit to the rotational speed and no upper limit to the dropping rate. Practically, the rotational speed is preferably at least 5 rpm. With respect to the dropping rate, the polishing surface plate may be immersed in the abrasive solution, in an extreme case, and there also is no upper limit in practical use.

Further, it is preferable that the abrasive solution used in the present invention contains pure water used as a solvent, and that the ratio of the abrasive particles to the abrasive solution is at least 0.1 wt % and at most 5 wt % if there is no dispersing agent for dispersing the abrasive particles in the solvent. The reason is that sedimentation of the abrasive particles in the abrasive solution occurs when the weight ratio of the abrasive particles is high, and conversely, the processing efficiency decreases when the weight ratio of the abrasive particles is low.

Furthermore, it is preferable that, in the polishing process of the present invention, the entire upper surface of the polishing surface plate is always covered with the abrasive solution. This is because a dry polishing surface plate and a wet polishing surface plate provide different frictional resistances to portions where the abrasive particles, the polishing surface plate and the silicon carbide substrate come in contact, and a dry polishing surface plate provides increased frictional resistance, causing a great amount of process scratches on the surface of the silicon carbide substrate.

Furthermore, it is preferable that in the polishing process of the present invention, polishing is performed while applying a surface pressure of at least 100 gf/cm$^2$ and at most 200 gf/cm$^2$ to the silicon carbide crystal substrate. The reason is that a surface pressure less than 100 gf/cm$^2$ cannot provide a practical processing rate, and with a surface pressure exceeding 200 gf/cm$^2$, on the other hand, there is the risk of damaging the silicon carbide substrate.

According to the present invention, by using boron carbide as abrasive particles in place of conventionally used diamond, it is possible to reduce the damage caused to the silicon carbide crystals, which constitute the material to be polished, and to the surface of the polishing surface plate, and to perform surface polishing precisely.

EMBODIMENT

An embodiment of the method for producing a silicon carbide substrate according to the present invention will be described in detail with reference to the accompanying drawings. It should be noted that the present invention is not limited to the following embodiment.

Figure 1B:
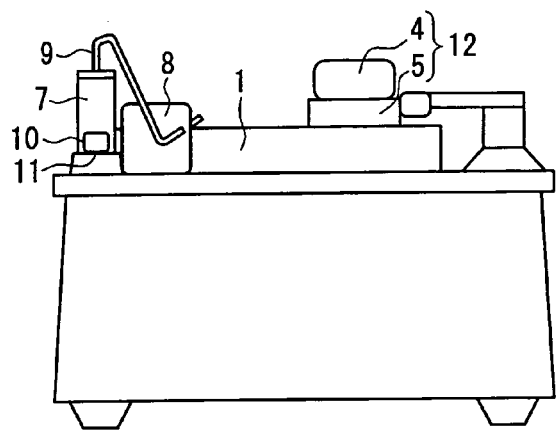
FIG. 1B is a side view thereof.
Figure 1C:
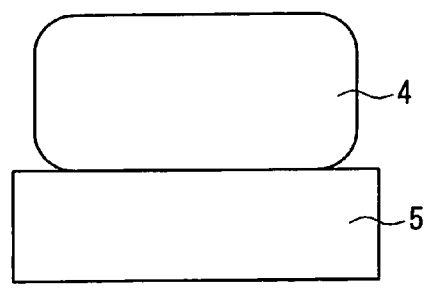
FIG. 1C is an enlarged view of portion 12 in FIG. 1B.
Figure 1D:
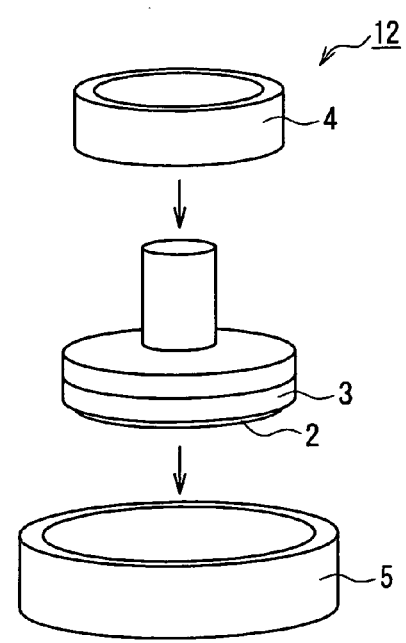
FIG. 1D is an assembly diagram of FIG. 1C.

FIG. 1A is a plan view of a polishing apparatus according to one embodiment of the present invention, FIG. 1B is a side view thereof, FIG. 1C is an enlarged view of an assembly 12 of a weight and a work guide that are shown in FIG. 1B, and FIG. 1D is an assembly diagram of FIG. 1C. As shown in FIG. 1A to FIG. 1D, a bonding jig 3 to which a silicon carbide substrate 2 is bonded, and an appropriate weight 4 for applying pressure are placed on a polishing surface plate 1. Thereafter, a work guide 5 is attached outside the silicon carbide substrate 2, the bonding jig 3 and the weight 4. By rotating the polishing surface plate 1 in the direction of the arrow P, the silicon carbide substrate 2, the bonding jig 3, the weight 4 and the work guide 5 rotate on the polishing surface plate 1 in the direction of the arrow Q while being supported by an arm 6. Then, an abrasive solution 7 containing abrasive particles made of boron carbide is dropped periodically onto the polishing surface plate 1 via a silicon tube 9 using a tubing pump 8 (e.g., a cassette tubing pump SMP-2 manufactured by Tokyo Rikakikai Co., Ltd.) and thus the polishing advances. Here, for example, a commercially available stirring member 10 containing a magnet is placed in a vessel of the abrasive solution 7, and stirring is performed from below the vessel using a commercially available stirrer 11, such that the abrasive particles made of boron carbide in the abrasive solution 7 do not settle out. Here, it is possible to use, for example, a magnetic stirrer and a stirring element that are manufactured by Tokyo Rikakikai Co., Ltd. as the stirring element 10 and the stirrer 11.

In this case, while the silicon carbide substrate 2, the bonding jig 3, the weight 4 and the work guide 5 can be rotated without attaching a motor to the arm 6, it is more preferable to attach a motor to the arm 6 so as to allow the arm 6 to rotate independently, since this permits the silicon carbide substrate 2, the bonding jig 3, the weight 4 and the work guide 5 to be rotated at a more stable rotational speed. In this case, the direction of rotation of the polishing surface plate 1 and that of the arm 6 may be the same or opposite. Further, a rocking mechanism may be attached to the arm 6.

It is preferable that the composition of the abrasive solution 7 is made up of pure water and an abrasive particle component made of boron carbide, and that the weight ratio of the abrasive particles made of boron carbide, to pure water, is at least 0.1% and at most 5%. When the weight ratio of the abrasive particles made of boron carbide in the abrasive solution 7 is more than 5%, the abrasive particle component made of boron carbide settles out in the abrasive solution 7 during polishing to produce abrasive particles that are not suitable for polishing, resulting in reduced processing efficiency. Furthermore, the settled abrasive particles made of boron carbide form flocs, thereby distorting the particle shape and causing process scratches on the polishing surface plate 1 or to the silicon carbide substrate 2 during polishing. Moreover, a concentration distribution is formed in the abrasive solution 7, and this leads to nonuniform processing quality. When the weight ratio of boron carbide in the abrasive solution 7 is low (if not 0%), the surface roughness of the silicon carbide substrate 2 after polishing is improved, although the processing efficiency is decreased.

During polishing, it is preferable that the abrasive solution 7 is supplied onto the polishing surface plate 1 while constantly stirring the abrasive solution 7. The reason is that some sedimentation may occur over a long period of polishing even in an abrasive solution 7 in which the weight ratio of boron carbide is 2 to 3%. Further, the dispersibility of the abrasive solution 7 may be improved by adding a dispersing agent such as ethylenediaminetetracetic acid, which is an amine-based material.

Further, it is effective to perform the polishing process a multiple number of times, using different abrasive particles. That is to say, it is preferable to use abrasive particles of boron carbide having a larger average particle size as the abrasive particles contained in the abrasive solution 7 for the initial polishing, since the silicon carbide substrate 2 has a high surface roughness before it is subjected to polishing, and to decrease the average particle size of the abrasive particles gradually as the polishing process advances. In general, when the same surface pressure is applied to a substrate that is to be polished, the larger the average particle size of abrasive particles, the higher the processing rate becomes (the shorter the polishing time becomes) and the higher the surface roughness after polishing becomes. Conversely, the smaller the average particle size of abrasive particles, the lower the processing rate and the lower the surface roughness after polishing becomes.

Table 1 shows the relationship between the average particle size of boron carbide contained in the abrasive solution 7, and the surface pressures applied to and the processing rates of the silicon carbide crystal substrate 2, when a silicon carbide substrate 2 having a surface roughness of 50 µm (Rz: maximum height) was polished as a working example of the present invention. In Table 1, the average particle sizes of boron carbide contained in the abrasive solution 7 were 20 µm, 40 µm, 60 µm, 80 µm, 100 µm and 120 µm, the surface pressures applied to the silicon carbide substrate 2 were 0 gf/cm$^2$ (tare weight only), 50 gf/cm$^2$, 100 gf/cm$^2$, 150 gf/cm$^2$, 200 gf/cm$^2$ and 250 gf/cm$^2$. The processing rate was determined for each combination of the above-described average particle sizes of boron carbide and surface pressure applied to the silicon carbide substrate 2, by comparing values calculated from the weight difference of the silicon carbide substrate 2 before and after the processing, measured with an electronic balance. A processing rate of 30 µm/h or higher, which was sufficiently high, was rated as A, a processing rate of about 10 µm/h, which showed a slight degree of processing, was rated as B, a processing rate that was not 0 µm/h but yielded almost no processing, was rated as C, and a processing rate that caused damage to the silicon carbide substrate 2 was rated as D.

TABLE 1

| average particle size (µm) | surface pressure (gf/cm$^2$) | processing rate |
|---|---|---|
| 20 | 0 | C |
|  | 50 | C |
|  | 100 | C |
|  | 150 | C |
|  | 200 | C |
|  | 250 | D |
| 40 | 0 | C |
|  | 50 | C |
|  | 100 | C |
|  | 150 | C |
|  | 200 | B |
|  | 250 | D |
| 60 | 0 | C |
|  | 50 | C |
|  | 100 | A |
|  | 150 | A |
|  | 200 | A |
|  | 250 | D |
| 80 | 0 | C |
|  | 50 | C |
|  | 100 | A |
|  | 150 | A |
|  | 200 | A |
|  | 250 | D |
| 100 | 0 | C |
|  | 50 | C |
|  | 100 | A |
|  | 150 | A |
|  | 200 | A |
|  | 250 | D |
| 120 | 0 | C |
|  | 50 | C |
|  | 100 | C |
|  | 150 | C |
|  | 200 | C |
|  | 250 | D |

As shown in Table 1, when the surface pressure was 250 gf/cm$^2$ or higher, damage was caused to the substrate under all the conditions, whereas no damage was caused to the substrate when the surface pressure was 200 gf/cm$^2$ or lower. Therefore, it is preferable that the surface pressure is at most 200 gf/cm$^2$, regardless of the average particle size of the abrasive particles. When the average particle size of boron carbide was 120 µm, stirring could not be performed sufficiently in the abrasive solution 7, so that sedimentation or flocculation of the abrasive particles occurred, and effective polishing could not be performed. Therefore, it is preferable that the average particle size of abrasive particles using boron carbide is at most 100 µm.

Furthermore, when the average particle size of boron carbide serving as the abrasive particles was large, a clear correlation could be seen between the processing rate and the surface pressure. That is, when the average particle size of boron carbide is 60 to 100 μm, the surface pressure that provides the optimum processing rate is 100 to 200 gf/cm².

Therefore, according to the present invention, it is preferable to perform the initial polishing using abrasive particles made of boron carbide having a relatively large average particle size of about 60 μm to 100 μm, with a surface pressure of 100 to 200 gf/cm² being applied to the silicon carbide substrate 2, thereby roughly correcting the surface of the silicon carbide substrate 2, and then to perform the finish polishing using abrasive particles made of boron carbide having a smaller average particle size to obtain the desired polished surface.

In the finish polishing, greater importance is given to the surface roughness and the surface states after polishing rather than to the processing rate, as compared with the initial polishing. Table 2 summarizes the surface roughness of the silicon carbide substrate 2 when polishing was performed with boron carbide abrasive particles contained in the abrasive solution 7 having average particle sizes of 1 μm, 5 μm, 10 μm, 20 μm, 40 μm, 60 μm, 80 μm and 100 μm.

TABLE 2

| average particle size (μm) | surface roughness |
|---|---|
| 1 | A |
| 5 | A |
| 10 | A |
| 15 | B |
| 20 | C |
| 40 | C |
| 60 | C |
| 80 | C |
| 100 | C |

The surface roughness after completion of the polishing was measured with an Rz value, using a "Newview5032" (product name), manufactured by Zygo Corporation. A Rz value of 1.0 μm or less was rated as A, a Rz value of slightly more than 1.0 μm was rated as B, and a Rz value of significantly more than 1 μm was rated as C. Here, since it is preferable that the surface roughness of the silicon carbide substrate 2 after the last polishing in which polishing is performed using boron carbide is Rz=at most 1 μm, it is preferable that the average particle size of boron carbide contained in the abrasive solution 7 is at most 10 μm during the last polishing with boron carbide.

The material of the polishing surface plate 1 may not necessarily be a special material, and may be a material, such as cast iron, that is commonly employed for rough polishing using diamonds. It is desirable that the surface pressure at which the silicon carbide substrate 2 is pressed against the polishing surface plate 1 is 100 gf/cm² to 200 gf/cm², as shown in Table 1. When the surface pressure is higher than 200 gf/cm², cracking tends to occur in the silicon carbide substrate 2, as shown in Table 1.

Further, the rotational speed of the silicon carbide substrate 2 that is provided by the polishing surface plate 1 and the arm 6 varies depending on, for example, the size of the polishing surface plate 1 and the silicon carbide substrate 2, the material and the groove shape of the polishing surface plate 1, and the match between the silicon carbide substrate 2 and the polishing surface plate 1, the concentration of the abrasive solution 7, the temperature and humidity during processing and the shape of the polishing apparatus. However, the maximum rotational speed is 40 rpm when an abrasive solution 7 containing abrasive particles made of boron carbide having a concentration of 5 wt % is dropped at a rate of 5 cc per minute, using a polishing surface plate 1 made of cast iron having a diameter of 200 mm and a silicon carbide substrate 2 of 5.08 cm (2 inches). When the rest of the polishing conditions are the same, a lower rotational speed particularly is effective, for example, in the final stage of this embodiment, since the damage caused to the surface of the silicon carbide substrate 2 is reduced, although the processing efficiency is decreased. Conversely, a higher rotational speed makes the abrasive solution 7 on the polishing surface plate 1 easy to scatter, so that the polishing surface plate 1 dries out more easily. This must be avoided, since a dry polishing surface plate 1 causes flocculation of the abrasive particles on the polishing surface plate 1, thus also causing damage. It normally is preferable that the rotational speed of the polishing surface plate 1 and the silicon carbide substrate 2 are decreased with an increase in the sizes of the polishing surface plate 1 and the material to be polished, which corresponds to the silicon carbide substrate 2 in this embodiment. When the sizes of the polishing surface plate 1 and the material to be polished are large, a larger amount of the abrasive solution 7 is required for preventing the upper surface of the polishing surface plate 1 from drying, compared to when the size of the material to be polished is small. Accordingly, the efficiency will be impaired unless processing is performed at a lower speed. In addition, when the size of the polishing surface plate 1 is large, the circumferential speed of the portion that is actually processed becomes faster. Therefore, the processing efficiency decreases less easily than when the size of the polishing surface plate is small even at a decreased rotational speed. The same holds true for the size of the silicon carbide substrate 2. As previously discussed, these actual processing conditions also are influenced greatly by the sizes of the polishing surface plate 1 and the silicon carbide substrate 2, the material and the groove shape of the polishing surface plate 1, and the match between the silicon carbide substrate 2 and the polishing surface plate 1, the concentration of the abrasive solution 7, the temperature and humidity during processing and the shape of the polishing apparatus. Additionally, the polishing surface plate 1 does not need to be circular, and does not need to perform polishing while making rotational motion. Instead, it also may move linearly or irregularly.

Hereinafter, the effects of the polishing method according to the present invention will be described in further detail by way of examples.

Working Example 1

An abrasive solution 7 was used that was made up of pure water and abrasive particles made of boron carbide having two different average particle sizes (60 μm and 1 μm) and manufactured by DENKI KAGAKU KOGYO KABUSHIKI KAISHA. The ratio of the abrasive particles to the abrasive solution was 5 wt %. The abrasive particles having an average particle size of 60 μm was used for a first step (an initial polishing step), and the abrasive particles having an average particle size of 1 μm was used for a second step (a finish polishing step). In each of the steps, the abrasive solution 7 was stirred using a stirring element such that no sedimentation of the abrasive particles occurred during polishing. Further, cast iron was used for the polishing surface plate 1. A SiC single crystal substrate manufactured by CREE, INC was used as the silicon carbide substrate 2. Electron wax manufactured by Nikka Seiko Co., Ltd, was used to bond the silicon carbide substrate 2 to the bonding jig 3.

The abrasive solution 7 was dropped onto the polishing surface plate 1 at a rate of 5 cc per minute, while applying a surface pressure of 200 gf/cm$^2$ to the silicon carbide substrate 2 using the weight 4, with the rotational speed of the polishing surface plate 1 and the arm 6 being set to 40 rpm in the same direction. Further, the initial state of the surface of the silicon carbide substrate 2 that was subjected to polishing was Rz=50 µm, and the processing time was 15 minutes in the first step and 60 minutes in the second step.

Comparative Example 1

Diamond slurry manufactured by FRT Japan Ltd. was used for the abrasive solution 7. The average particle size of the abrasive particles made of diamond in the diamond slurry was 1 µm. A surface pressure of 150 gf/cm$^2$ was applied to the silicon carbide substrate 2 using the weight 4. Only the first processing step was performed, and this was performed in the same manner as Working Example 1, except that the abrasive solution 7 used was diamond slurry and the surface pressure applied to the silicon carbide substrate 2 using the weight 4 was 150 gf/cm$^2$. The processing time was 45 minutes.

Of the results from polishing in the first and second steps of Working Example 1 and in Comparative Example 1, Table 3 shows the processing rate under each processing condition, as well as the state of the final processed surface of the silicon carbide substrate 2 and the state of the polishing surface plate 1 of each of Working Example 1 and Comparative Example 1. The processing rates are expressed as amounts per hour, and were determined by measuring the weight of the silicon carbide substrate 2 using an electronic balance before and after polishing in the first and second steps of Working Example 1 and Comparative Example 1 and calculating the amounts removed by the processing, wherein the specific gravity of the silicon carbide substrate 2 was taken to be 3.2. Further, the state of the final processed surface of the silicon carbide substrate 2 was measured by measuring the surface roughness (Rz value) using a "New view5032" (product name), manufactured by Zygo Corporation. Further, the depth of process scratches on the surface of the silicon carbide substrate was measured with a laser microscope (VK8500, manufactured by KEYENCE CORPORATION). The surface state of the polishing surface plate 1 was examined by visual inspection. A surface state that was substantially the same as that before the processing was rated as A, and a state in which any process scratch or the like was observed was rated as B.

TABLE 3

|  | working example 1 | | comparative |
| --- | --- | --- | --- |
|  | 1st step | 2nd step | example 1 |
| surface pressure (gf/cm$^2$) | 200 | 200 | 150 |
| processing rate (µm/h) | 60 | 1.0 | 7.2 |
| surface roughness (average value) Rz of silicon carbide substrate (µm) | — | 0.5 | 0.5 |
| maximum depth of process scratches of silicon carbide substrate (µm) | — | 0.4 | 1.0 |
| surface state of polishing surface plate | — | A | B |

As shown in Table 3, when a comparison is made between the boron carbide having an average particle size of 1 µm (the second step) and the diamond (Comparative Example 1), the diamond of Comparative Example 1 yields a better processing rate. That is, from the results relating to the processing rate, it seems that a polishing time 7.2 times longer than that of Comparative Example 1 is required, in order to perform processing equivalent to that of Comparative Example 1 with just the second step. However, by dividing the polishing process into two steps and using boron carbide having an average particle size of 60 µm for the first step, it is possible to reduce the polishing time such that it is about 1.7 times longer than that of Comparative Example 1, and to achieve the same surface roughness after polishing, as that achieved by Comparative Example 1. From a comparison between the depth of process scratches after the polishing of the second step and that of Comparative Example 1, it also seems that the depth of process scratches can be 2.5 times less by performing polishing in the second step. If the depth of process scratches on the surface of the silicon carbide substrate 2 after rough polishing is small, then it is possible to achieve an effect of reducing the processing time significantly in the subsequent precision polishing. In this respect, since a precision polishing step requires a long processing time of from several hours to several tens of hours, it seems that the overall processing time can be reduced markedly by performing the polishing of Working Example 1. In addition, a significant amount of process scratches was observed in the polishing surface plate 1 after the processing in Comparative Example 1, whereas no such process scratch was observed for the first and second steps of the working example. Accordingly, unlike conventionally used abrasive diamond particles, the use of boron carbide as abrasive particles makes it possible to eliminate the need to perform corrective processing for the polishing surface plate even when a plurality of polishing steps are provided, and enables provision of a silicon carbide substrate having a high quality crystal surface.

The present invention is not limited to the process as shown in Working Example 1 where the average particle size of the abrasive particles used in the first step is 60 µm and the average particle size of the abrasive particles used in the second step is 1 µm. There is no substantial problem either in a process of using abrasive particles having an average particle size of 60 µm, 10 µm and 1 µm in the first, second and third steps respectively, or in a process of using abrasive particles having an average particle size of 80 µm, 10 µm and 1 µm in the first, second and third steps respectively.

According to the present invention, it is possible, by using boron carbide as abrasive particles, to provide a silicon carbide substrate with less damage caused to the silicon carbide substrate and the polishing surface plate than with commonly employed rough polishing using abrasive diamond particles, thus providing a useful method for polishing a silicon carbide substrate.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for polishing a silicon carbide crystal substrate, the method comprising:
    a polishing process of polishing a silicon carbide crystal substrate having a surface roughness before polishing Rz of at most 50 µm, using an abrasive solution containing abrasive particles made of boron carbide, wherein the polishing process, an average particle size of the abrasive particles that are used in an initial step is larger than an average particle size of the abrasive particles that are used in a final step and wherein the average particle size of the abrasive particles that is used in the initial step is at least 60 um and at most 100 um, and the average particle size of the abrasive particles that is used in the final step is at most 10 um.

2. The method for polishing a silicon carbide crystal substrate according to claim 1, wherein the polishing process comprises a plurality of polishing steps in which the average particle sizes of the abrasive particles that are used are different.

3. The method for polishing a silicon carbide crystal substrate according to claim 2, wherein, the average particle size decreases gradually as the polishing process advances.

4. The method for polishing a silicon carbide crystal substrate according to claim 1, wherein, in the polishing process, a polishing vessel containing the abrasive solution is placed on a polishing surface plate that polishes the silicon carbide crystal substrate, and the abrasive solution is dropped onto the polishing surface plate, while performing stirring in the polishing vessel such that the abrasive particles contained in the abrasive solution inside the polishing vessel do not settle out.

5. The method for polishing a silicon carbide crystal substrate according to claim 4, wherein the polishing surface plate has a rotational speed of at most 40 rpm.

6. The method for polishing a silicon carbide crystal substrate according to claim 4, wherein the abrasive solution is dropped onto the polishing surface plate at a rate of at least 5 cc/min.

7. The method for polishing a silicon carbide crystal substrate according to claim 1, wherein the abrasive solution contains pure water used as a solvent, and the ratio of the abrasive particles to the abrasive solution is at most 5 wt % if there is no dispersing agent for dispersing the abrasive particles in the solvent.

8. The method for polishing a silicon carbide crystal substrate according to claim 1, wherein, in the polishing process, the entire upper surface of the polishing surface plate is always covered with the abrasive solution.

9. The method for polishing a silicon carbide crystal substrate according to claim 1, wherein, in the polishing process, polishing is performed while applying a surface pressure of at least 100 gf/cm$^2$ and at most 200 gf/cm$^2$ to silicon carbide crystal substrate.

10. A method for polishing a silicon carbide crystal substrate, the method comprising:

a polishing process of polishing a silicon carbide crystal substrate having a surface roughness before polishing Rz of at most 50 µm, using an abrasive solution containing abrasive particles made of boron carbide, wherein, in the polishing process, polishing is performed while applying a surface pressure of at least 100 gf/cm$^2$ and at most 200 gf/cm$^2$ to silicon carbide crystal substrate.

11. The method for polishing a silicon carbide crystal substrate according to claim 10, wherein the polishing process comprises a plurality of polishing steps in which the average particle sizes of the abrasive particles that are used are different.

12. The method for polishing a silicon carbide crystal substrate according to claim 11, wherein, in the polishing process, an average particle size of the abrasive particles that are used in an initial step is larger than an average particle size of the abrasive particles tat are used in a final step, and the average particle size decreases gradually as the polishing process advances.

13. The method for polishing a silicon carbide crystal substrate according to claim 12, wherein the average particle size of the abrasive particles that is used in the initial step is at least 60 µm and at most 100 µm and the avenge particle size of the abrasive particles that is used in the final step is at most 10 µm.

14. The method for polishing a silicon carbide crystal substrate according to claim 12, wherein, in the polishing process, a polishing vessel containing the abrasive solution is placed on a polishing surface plate that polishes the silicon carbide crystal substrate, and the abrasive solution is dropped onto the polishing surface plate, while performing stirring in the polishing vessel such tat the abrasive particles contained in the abrasive solution inside the polishing vessel do not settle out.

15. The method for polishing a silicon carbide crystal substrate according to claim 14, wherein the polishing surface plate has a rotational speed of at most 40 µm.

16. The method for polishing a silicon carbide crystal substrate according to claim 14, wherein the abrasive solution is dropped onto the polishing surface plate at a rate of at least 5 cc/min.

17. The method for polishing a silicon carbide crystal substrate according to claim 10, wherein the abrasive solution contains pure water used as a solvent, and the ratio of the abrasive particles to the abrasive solution is at most 5 wt % if there is no dispersing agent for dispersing the abrasive particles in the solvent.

18. The method for polishing a silicon carbide crystal substrate according to claim 10, wherein, in the polishing process, the entire upper surface of the polishing surface plate is always covered with the abrasive solution.

* * * * *